(12) United States Patent
Riedel et al.

(10) Patent No.: US 9,837,450 B2
(45) Date of Patent: Dec. 5, 2017

(54) REDUCING PARASITIC LEAKAGES IN TRANSISTOR ARRAYS

(71) Applicant: FLEXENABLE LIMITED, Cambridge (GB)

(72) Inventors: Stephan Riedel, Dresden (DE); David Gammie, Cambridgeshire (GB); Boon Hean Pui, Kuala Lumpur (MY)

(73) Assignee: FLEXENABLE LIMITED, Cambridge (GB)

( * ) Notice: Subject to any disclaimer, the term of this patent is extended or adjusted under 35 U.S.C. 154(b) by 0 days.

(21) Appl. No.: 15/023,752

(22) PCT Filed: Oct. 7, 2014

(86) PCT No.: PCT/EP2014/071468
§ 371 (c)(1),
(2) Date: Mar. 22, 2016

(87) PCT Pub. No.: WO2015/052201
PCT Pub. Date: Apr. 16, 2015

(65) Prior Publication Data
US 2016/0233254 A1    Aug. 11, 2016

(30) Foreign Application Priority Data
Oct. 8, 2013    (GB) .................................. 1317761.3

(51) Int. Cl.
*H01L 27/12* (2006.01)
*G09G 3/34* (2006.01)
(Continued)

(52) U.S. Cl.
CPC ......... *H01L 27/1255* (2013.01); *G09G 3/344* (2013.01); *H01L 27/124* (2013.01); *H03K 17/6874* (2013.01); *H01L 27/283* (2013.01)

(58) Field of Classification Search
None
See application file for complete search history.

(56) References Cited

U.S. PATENT DOCUMENTS

| | | | |
|---|---|---|---|
| 2002/0106847 A1 | 8/2002 | Kazlas et al. | |
| 2007/0058444 A1* | 3/2007 | Riedel | G11C 11/5671 365/185.29 |

FOREIGN PATENT DOCUMENTS

| | | |
|---|---|---|
| EP | 2 015 379 A2 | 1/2009 |
| JP | 09-92833 A | 4/1997 |

(Continued)

OTHER PUBLICATIONS

International Search Report of PCT/EP2014/071468 dated Dec. 15, 2014 [PCT/ISA/210].

(Continued)

*Primary Examiner* — Michael Lebentritt
(74) *Attorney, Agent, or Firm* — Sughrue Mion, PLLC (57) ABSTRACT

A method of operating a device comprising: a first conductor layer defining a plurality of source conductors each associated with a respective group of transistors, and a plurality of drain conductors each associated with a respective transistor; a semiconductor layer defining semiconductor channels between said source and drain conductors; a second conductor layer defining a plurality of gate conductors each associated with a respective set of transistors, and one or more storage capacitor conductors capacitively coupled to the drain conductors for a respective set of transistors; the method comprising: using the gate conductors to switch the transistors between on and off states; and using the storage capacitor conductors to reduce the conductivity of one or more semiconductor layer connecting the drain conductor of each transistor in the on state to source and/or drain conductors other than those associated with that transistor.

17 Claims, 10 Drawing Sheets

(51) Int. Cl.
*H03K 17/687* (2006.01)
*H01L 27/28* (2006.01)

(56) References Cited

FOREIGN PATENT DOCUMENTS

WO       01/15233 A1    3/2001
WO   2012/140084 A1   10/2012

OTHER PUBLICATIONS

Written Opinion of PCT/EP2014/071468 dated Dec. 15, 2014 [PCT/ISA/237].

* cited by examiner

Figure 11

REDUCING PARASITIC LEAKAGES IN TRANSISTOR ARRAYS

Transistor arrays of increasing density (number of transistors per unit area) are used, for example, for producing increasingly high resolution display devices. It has been observed that the performance of transistor arrays for e.g. controlling display devices can be affected by leakage currents between conductors not associated with the same transistor via the semiconductor layer that provides the semiconducting channels for the transistors.

One technique aimed at reducing such leakage currents involves patterning the semiconductor layer so as to eliminate or reduce leakage paths in the semiconducting layer between conductors not associated with the same transistor.

The inventors have identified the challenge of providing an alternative technique for reducing parasitic leakage currents that either reduces or eliminates the need for patterning the semiconductor layer.

There is hereby provided a method of operating a device comprising an array of transistors, wherein the device comprises: a first conductor layer defining a plurality of source conductors, each source conductor associated with a respective group of transistors, and a plurality of drain conductors each associated with a respective transistor; a semiconductor layer defining semiconductor channels between said source and drain conductors for said array of transistors; a second conductor layer defining a plurality of gate conductors each associated with a respective set of transistors, and one or more storage capacitor conductors capacitively coupled to at least a portion of the drain conductors for a respective set of transistors; wherein the method comprises: using the gate conductors to switch the transistors between on and off states; and using the storage capacitor conductors to reduce the conductivity of one or more portions of the semiconductor layer connecting the drain conductor of each transistor in the on state to source and/or drain conductors other than those associated with that transistor.

According to one embodiment, each drain conductor comprises a pad conductor connected by a line conductor to a drain electrode, and wherein said one or more storage capacitor conductors are configured to overlap with the whole of a perimeter portion of the semiconductor layer at the perimeter of each pad conductor.

There is also hereby provided a device comprising an array of transistors, wherein the device comprises a first conductor layer defining a plurality of source conductors each associated with a respective group of transistors, and a plurality of drain conductors each associated with a respective transistor; and a semiconductor layer providing the semiconductor channels for said array of transistors; wherein each source conductor is configured to lie between all conducting paths between the group of drain conductors associated with that source conductor and all other source conductors via the semiconductor layer.

According to one embodiment, the group of drain conductors associated with a source conductor extend in a first direction, and each source conductor comprises two line conductors extending in said first direction on opposite sides of said group of drain conductors associated with the source conductor.

According to one embodiment, each source conductor comprises further conductors connecting said two line conductors in regions between drain conductors associated with the source conductor.

According to one embodiment, the device further comprises a plurality of gate conductors, each gate conductor is capacitatively coupled to the semiconducting channels for a respective set of transistors, and is also capacitatively coupled to a portion of the drain conductors for another set of transistors whose semiconducting channels are capacitatively coupled to an adjacent gate conductor; and wherein each source conductor comprises one or more portions extending between the drain conductors of adjacent transistors in the same group of transistors associated with the same source conductor.

According to one embodiment, each source conductor wholly encompasses the drain conductors associated with the source conductor.

There is also hereby provided an apparatus for operating a device comprising an array of transistors, wherein the device comprises: a first conductor layer defining a plurality of source conductors, each source conductor associated with a respective group of transistors, and a plurality of drain conductors each associated with a respective transistor; a semiconductor layer defining semiconductor channels between said source and drain conductors for said array of transistors; a second conductor layer defining a plurality of gate conductors each associated with a respective set of transistors, and one or more storage capacitor conductors capacitively coupled to at least a portion of the drain conductors for a respective set of transistors; wherein the apparatus is configured to apply different voltages to the gate conductors to switch the transistors between on and off states; and is further configured to apply a voltage to the storage capacitor conductors that reduces the conductivity of one or more portions of the semiconductor layer connecting the drain conductor of each transistor in the on state to source and/or drain conductors other than those associated with that transistor.

According to one embodiment, each drain conductor comprises a pad conductor connected by a line conductor to a drain electrode, and wherein said one or more storage capacitor conductors are configured to overlap with the whole of a perimeter portion of the semiconductor layer at the perimeter of each pad conductor.

Embodiments of the present invention are described hereunder in detail, by way of example only, with reference to the accompanying drawings, in which.

Transistor arrays may comprise a patterned conductor layer defining: an array of independent source conductors and an array of independent drain conductors. Each source conductor defines the source electrodes for a respective column of transistors, and provides a conductive connection between each transistor of the respective line of transistors to a terminal at the edge of the array. Each drain conductor defines the drain electrode for a respective transistor. The drain conductors may also provide relatively large area conductor pads, which form storage capacitors with other conducting elements of the transistor array such as common electrode (COM) lines. Transistor arrays may further comprise an organic semiconductor layer that provides the semiconducting channels between the source conductors and the drain conductors. Transistor arrays may further comprise a further patterned conductor layer defining an array of gate conductors, each gate conductor defining the gate electrode for a respective row of transistors (wherein a row indicates a line of transistors extending in a direction substantially perpendicular to the columns of transistors mentioned above). A method of operating the transistor array may comprise applying an on-voltage to each of the gate conductors in sequence (whilst applying an off-voltage to all other gate conductors); and whilst a gate conductor is "on", applying respective voltages to the source conductors to achieve the desired electric potential at the drain conductors of the transistors in the row of transistors with which the "on" gate conductor is associated. Ideally, the voltage applied to any source conductor when a gate conductor is "on" does not substantially affect the electric potential at the drain conductors of transistors associated with the other, "off" gate conductors and/or transistors associated with the same "on" gate conductor but associated with different source conductors.

Figure 1:
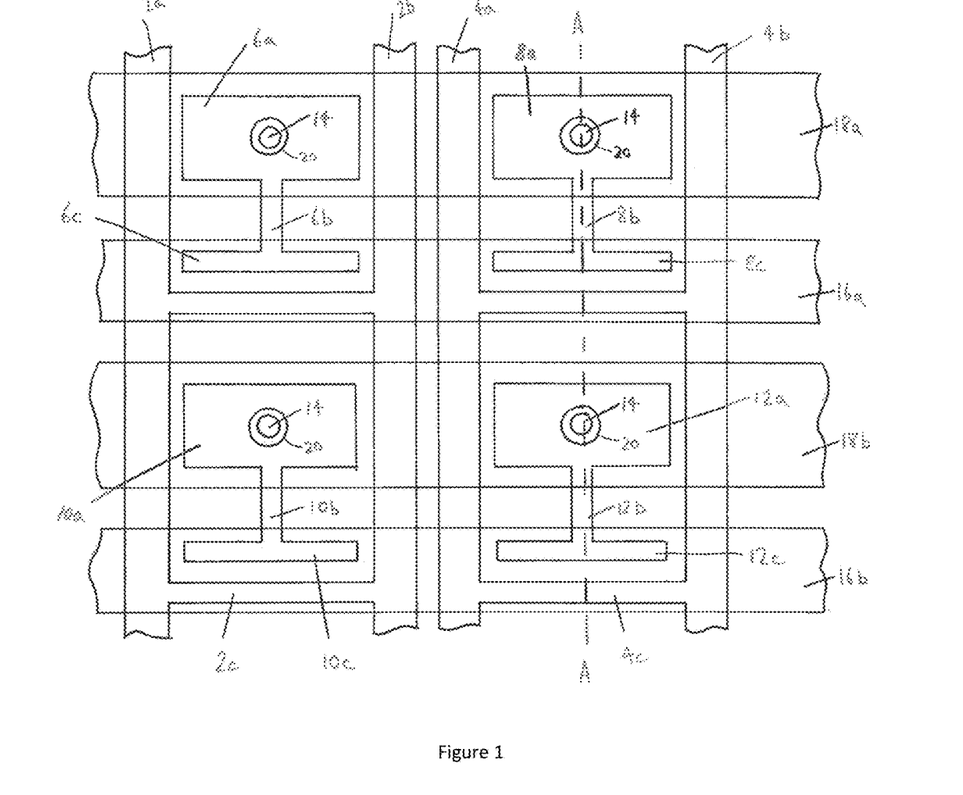
FIG. 1 illustrates a configuration for the source and drain conductors of a transistor array according to an embodiment of the present invention, and illustrates a configuration for the storage capacitor conductors of a transistor array according to an embodiment of the present invention.
Figure 2:
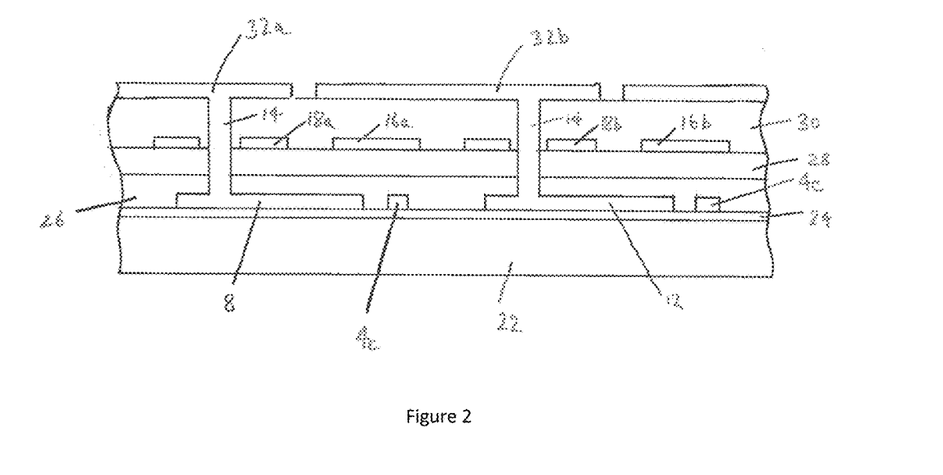
FIG. 2 illustrates a cross-section through line A-A in FIG. 1.

FIGS. 1 and 2 illustrate two examples of techniques for better isolating any transistor from transistor(s) associated with different source conductors and/or gate conductors.

FIG. 1 schematically illustrates the patterning of two conductor layers of a transistor array separated by a semiconductor layer 26, which provides the semiconducting channels of the transistors, and a gate dielectric layer 28 which capacitatively couples the gate conductors to the semiconducting channels. A lower patterned conductor layer is formed on a substrate (such as a plastic substrate, e.g. PEN or PET) via a planarisation layer 24. The lower patterned conductor layer defines a set of source conductors 2, 4 and a set of drain conductors 6, 8, 10 12.

The upper conductor layer defines a set of gate line conductors 16, and a set of COM line conductors 18 arranged in alternating sequence. The gate conductors 16 overlap (via the gate dielectric layer 28) with the portions of the semiconductor layer that connect the source and drain conductors where they are in closest proximity to each other.

Each drain conductor for a respective transistor comprises: (a) a drain electrode portion 6c, 8c, 10c, 12c in closest proximity (typically less than about 20 microns) to the source conductor associated with the transistor; (b) a drain pad conductor 6a, 6b, 6c, 6d providing a relatively large area conductor for good capacitative coupling with one of the COM line conductors 18; and (c) a narrow line conductor connecting the drain electrode to the drain conductor pad.

Conductive interlayer interconnects 14 connect each drain pad conductor (via a respective hole 20 in the overlying COM line conductor) to a respective pixel electrode 32 defined by a further patterned conductor layer overlying the upper patterned conductor layer via an insulator layer 30. The pixel electrodes 32 may be used, for example, to control the output of respective pixel portions of an electrophoretic optical display media (not shown).

Each COM line conductor 18 is configured to wholly overlap with the drain pad conductors for a respective row of transistors, and to also overlap with the whole of the perimeter portions of the semiconductor layer encompassing the perimeter of the drain pad conductors. The operation of the transistor array according to one embodiment of the invention involves applying simultaneously to all COM line conductors 18 (including those COM line conductors adjacent to any gate line conductor in an on-state) a voltage that significantly reduces via a field effect the conductance of the underlying portions of the semiconductor layer 26. According to one example, the voltages applied to the COM line conductors are the same as the "off" voltages applied to the gate line conductors. This reduction in the conductance of these portions of the semiconductor layer serves to better isolate the drain conductor of a transistor from both (a) source conductors other than that associated with the transistor, and also (b) drain conductors for other transistors associated with the same source conductor (but with a different gate conductor). In this example, an "off" voltage is continuously applied simultaneously to all COM lines 18 as the gate lines 16 are turned "on" in sequence.

Furthermore, each source conductor comprises (a) two conductor lines 2a, 2b, 4a, 4b that (i) extend in parallel on opposite sides of the drain conductors of the transistors with which the source conductor is associated, and (ii) connect to the same respective terminal at the edge of the transistor array; and (b) connecting portions 2c, 4c that connect the two conductor lines in regions between the drain conductors of the transistors with which the source conductor is associated. In the simple example illustrated in FIGS. 1 and 2, the connecting portions 2c, 4c are also the portions of the source conductors (source electrode portions) that are in closest proximity to the drain conductors. The provision of each source conductor as two conductor lines on either side of the drain conductors of the respective column of transistors serves to better isolate those drain conductors from source conductors associated with other columns of transistors. In more detail, this configuration of the source conductors can, for example, lead to better charging of the drain conductors to the desired electric potential (such as, for example, the electric potential required to switch the respective pixel portion of an electrophoretic display media to a different state), by reducing the leakage of charge from the drain conductor to a neighbouring source conductor (i.e. a source conductor for a neighbouring column of transistors) driven at a different voltage.

Furthermore, the provision of each source conductor for a respective column of transistors as two parallel line conductors connected to the same terminal at the edge of the array and connected to each other at intervals by the connecting portions 2c, 4c has the additional advantage that the source electrodes of each of the column of transistors remain connected to the respective source terminal at the edge of the array even in the event of a failure of one of the two source line conductors.

Figure 3:
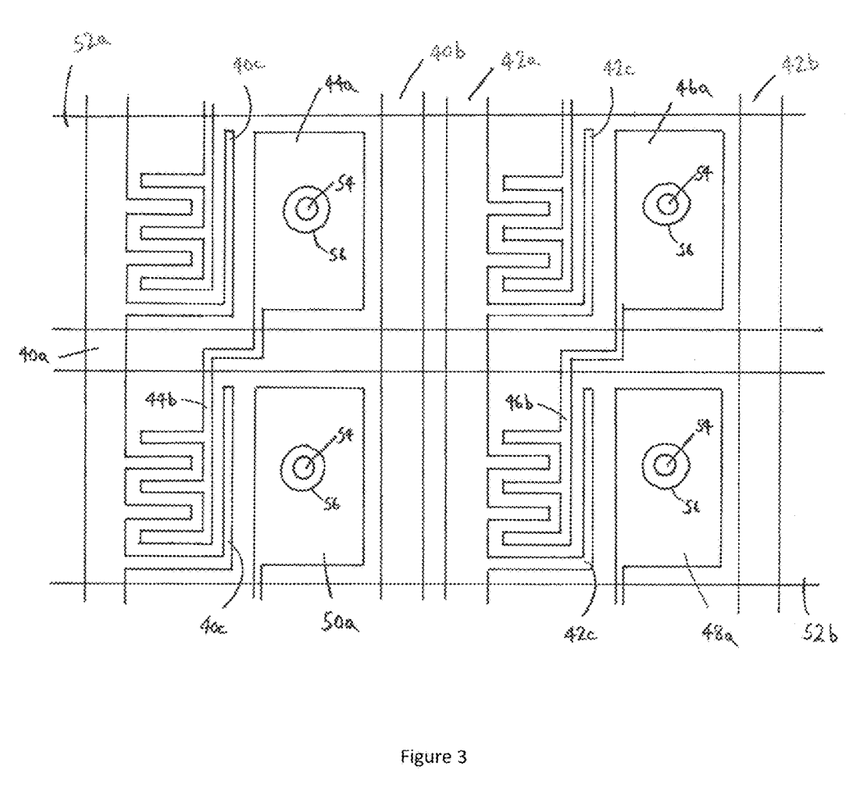
FIGS. 3 to 10 illustrate other configurations for the source and drain conductors of a transistor array according to other embodiments of the present invention.

FIG. 3 schematically illustrates an alternative technique for isolating drain conductors from one another. The transistor array of FIG. 3 is partly characterised by the absence of COM line conductors at the same level as the gate conductors 52. Instead, the required storage capacitance is achieved by configuring the drain conductor 44, 46, 48, 50 for each transistor such that it comprises a drain pad conductor (44a, 46a, 48a, 50a) that is capacitatively coupled to a gate conductor adjacent to the gate conductor associated with the transistor. The drain conductor pad for each transistor is connected via a line conductor to a drain electrode portion 44b, 46b in closest proximity (e.g. less than about 20 microns) to the source conductor 40. Similarly to the arrangement shown in FIGS. 1 and 2, interlayer interconnects 54 connect the drain pad conductors to a respectively overlying pixel conductor via a respective hole in the gate line conductors 52.

In FIG. 3, the source conductor 40, 42 for each column of transistors comprises two line conductors (40a and 40b, 42a and 42b) extending in parallel on opposite sides of the respective column of transistors with which the source conductor is associated. This arrangement serves to better isolate each drain conductor from the source conductors associated with adjacent columns of transistors.

In FIG. 3, each source conductor 40 for a respective column of transistors is configured to have isolating portions 40c that extend between (i) the drain electrode portion 44b, 46b of a transistor having a semiconducting channel capacitatively coupled with a gate conductor 52, and (ii) the drain conductor pad (for an adjacent transistor in the same column of transistors) capacitatively coupled with the same gate conductor. These isolating portions 40c extend substantially the whole length of the drain conductor pad in the direction in which the column of transistors extends; and serve to better isolate each drain conductor in that column of transistors from adjacent drain conductors in the same column of transistors.

Figure 4:
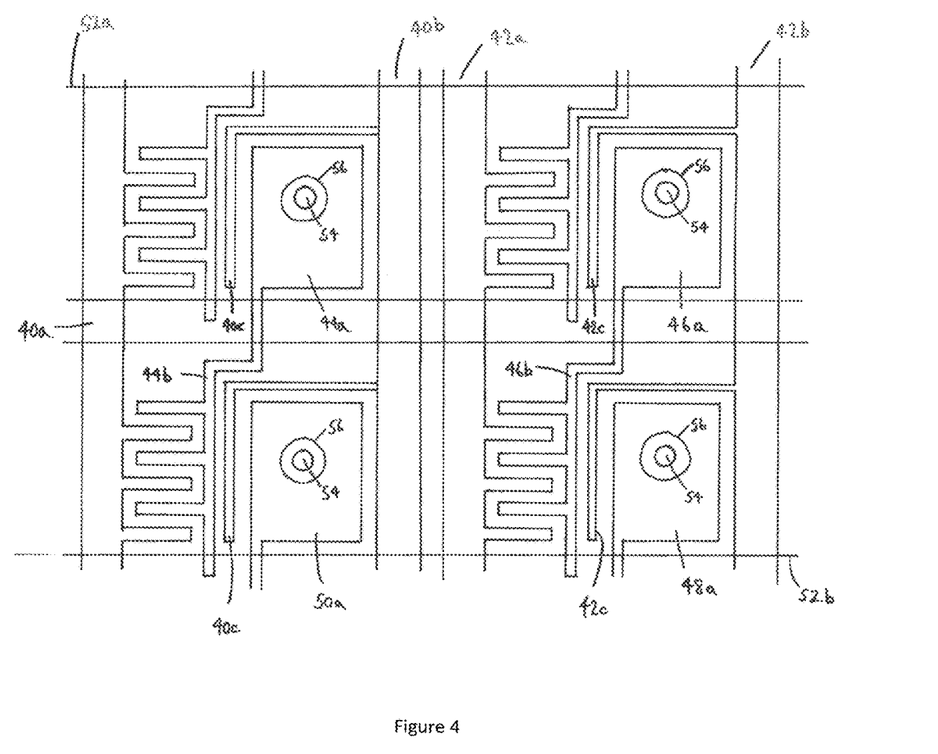

The configuration schematically illustrated in FIG. 4 is the same as that illustrated by FIG. 3 except that the isolating portions 40c, 42c extend from the one of the two source line conductors opposite to the source line conductor that defines the source electrode portions, i.e. the portions of the source conductor that are in closest proximity to the drain conductors.

Figure 5:
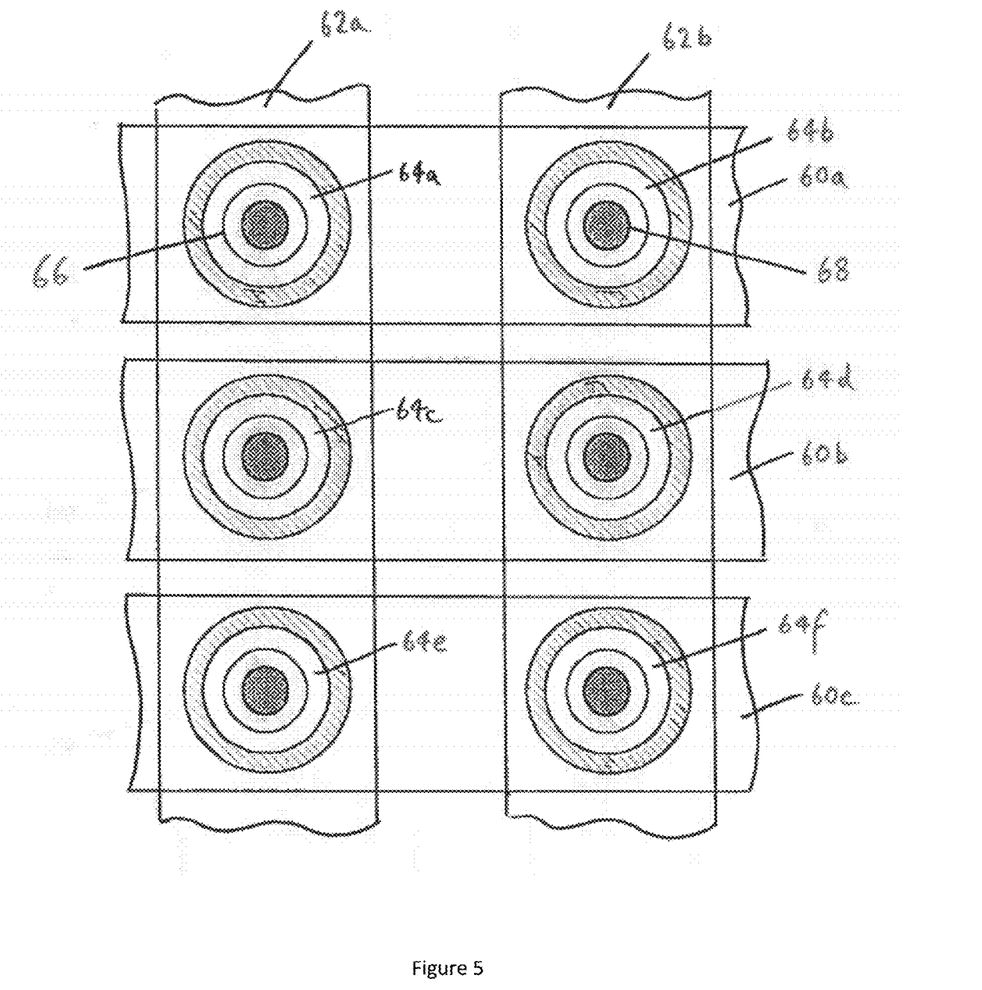

In the arrangement schematically illustrated in FIG. 5: a lower patterned conductor layer again defines the source and drain conductors for the array of transistors; but the source conductors for each respective column of transistors are configured as relatively wide line conductors 62a, 62b that define a substantially circular hole for each transistor; and the drain conductor for each transistor is defined as a substantially circular island conductor 64a-64f that lies wholly within the respective hole, and is centred on the centre of the respective hole. The diagonal hashing in FIG. 5 illustrates the location of the annular semiconducting channel for each transistor. Interlayer interconnects 68 provide conductive connections from the drain conductors 64 to a respective overlying pixel conductor (not shown) via respective holes in the gate conductors 60a, 60b, 60c. The arrangement shown in FIG. 5 also serves to better isolate the drain conductor pads from both (a) adjacent drain conductors associated with the same source conductor (i.e. drain conductors of transistors in the same column of transistors) and (b) source conductors associated with adjacent columns of transistors.

Figure 6:
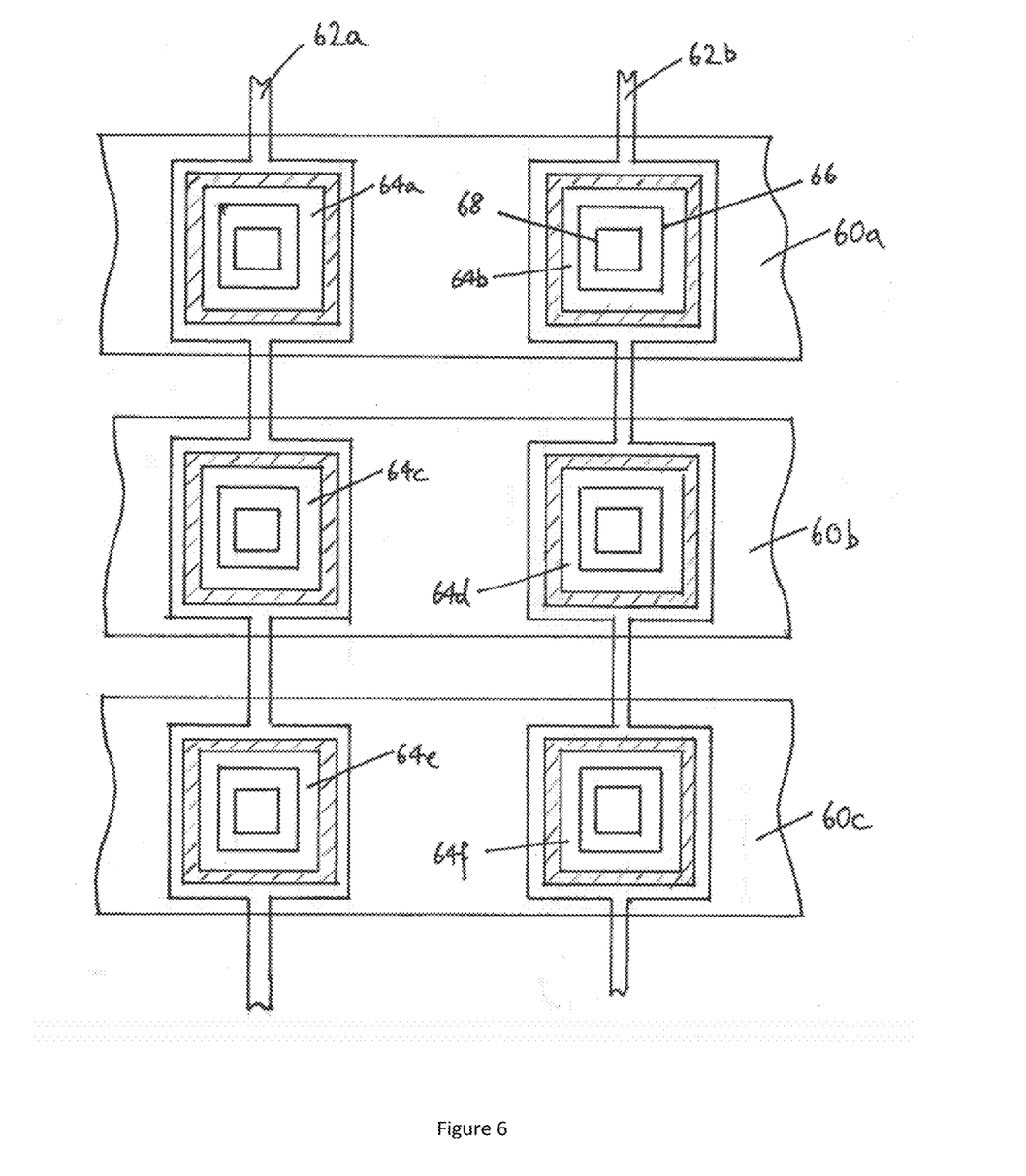

FIG. 6 schematically illustrates a similar arrangement to that illustrated in FIG. 5 except that it employs angular structures. The source conductors 62 define substantially square or rectangular holes, and the substantially square or rectangular source conductors each lie wholly within a respective hole.

Figure 7:
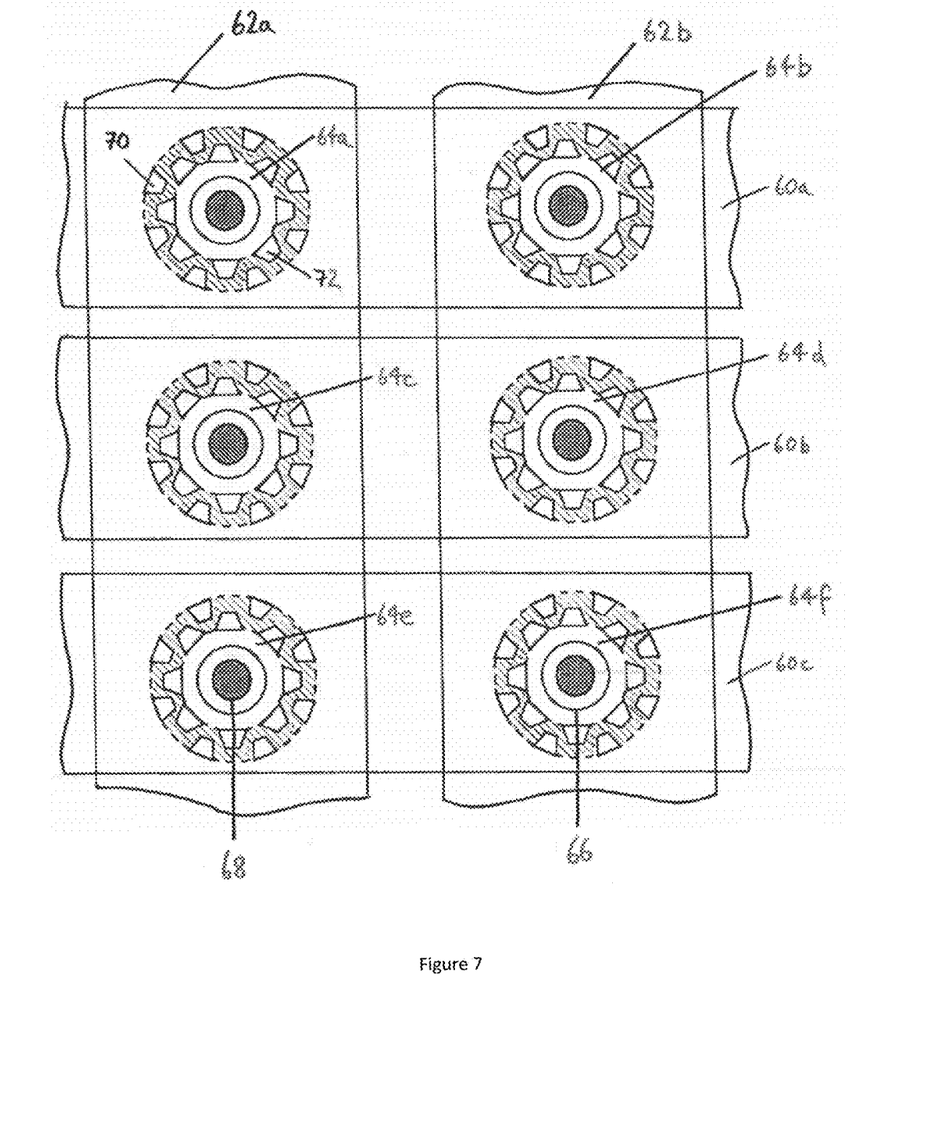

The arrangement schematically illustrated in FIG. 7 is the same as that schematically illustrated in FIG. 5, except that both the holes in the source conductors 62a, 62b and the island drain conductors are configured so as to increase the W:L ratio of the transistors; wherein L is the channel length (i.e. the shortest distance between the source and drain conductors) and W is the length of the semiconducting channel over which the source and drain conductors are separated by this shortest distance. In FIG. 6, the W:L ratio is increased by patterning the island drain conductors and the portions of the source conductor lines defining the holes such that the island drain conductors include outwardly radially extending projections 72 that extend into spaces defined by similar inwardly radially projections 70 defined by the source conductors.

Figure 8:
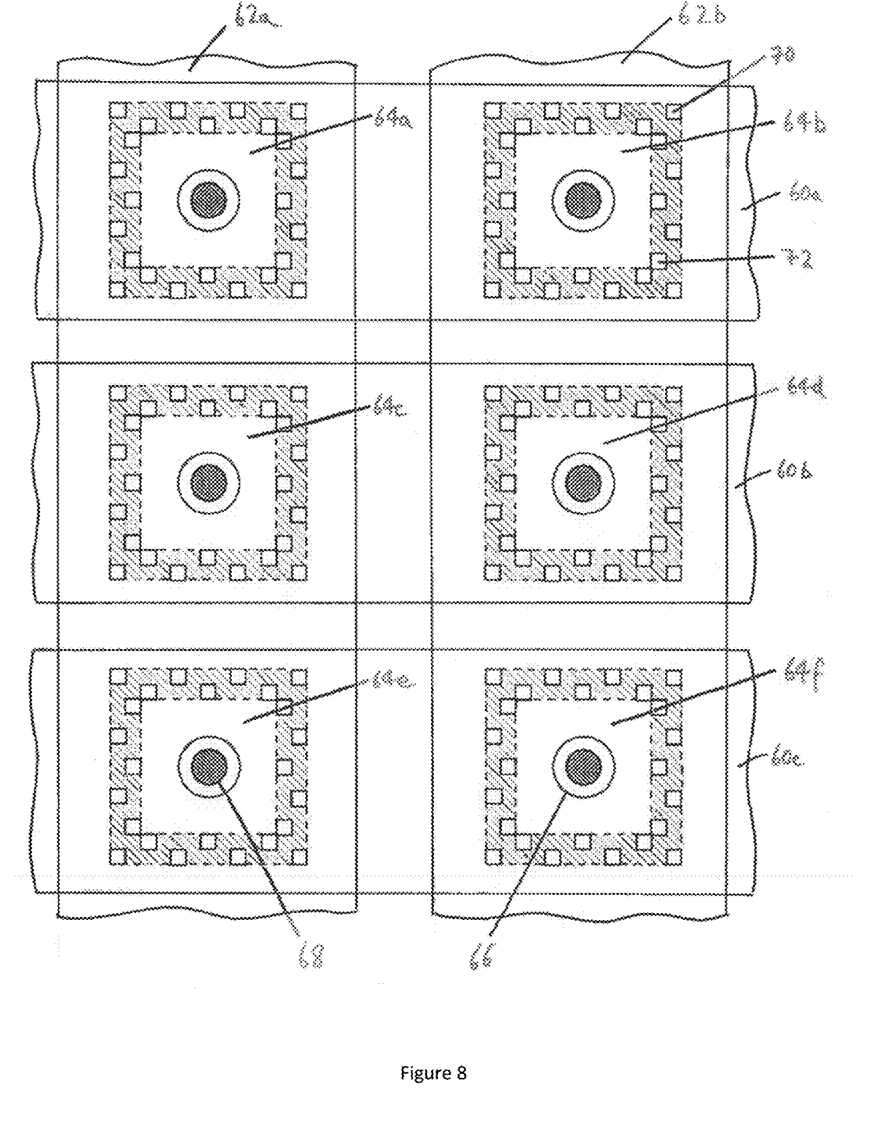

The arrangement schematically illustrated in FIG. 8 is the same as that schematically illustrated in FIG. 7, except that both the holes in the source conductors 62a, 62b and the island drain conductors have a substantially square or rectangular shape instead of a substantially circular shape. An increase in the W:L ratio is achieved in the same way as in FIG. 8 by means of complementary projections at the edges of the source and drain conductors.

Figure 9:
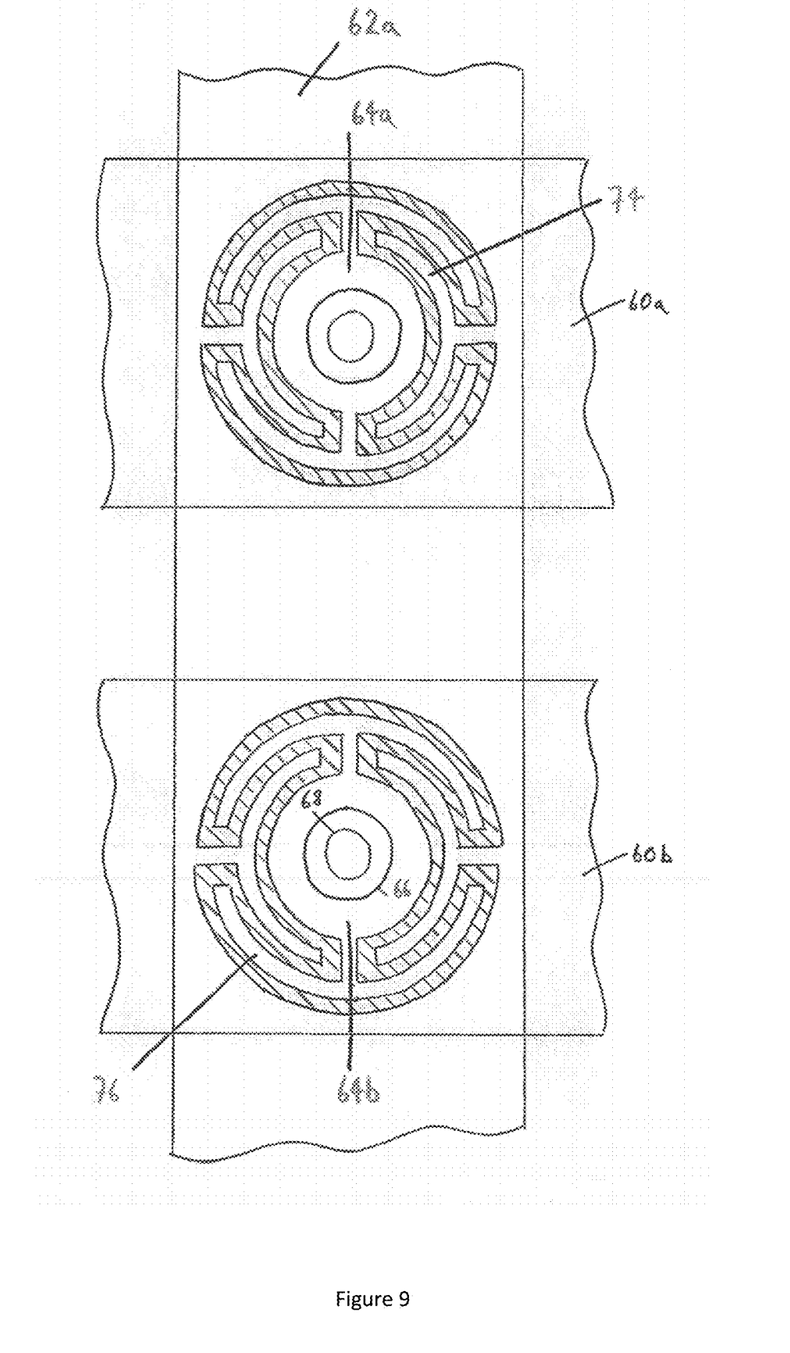
Figure 10:
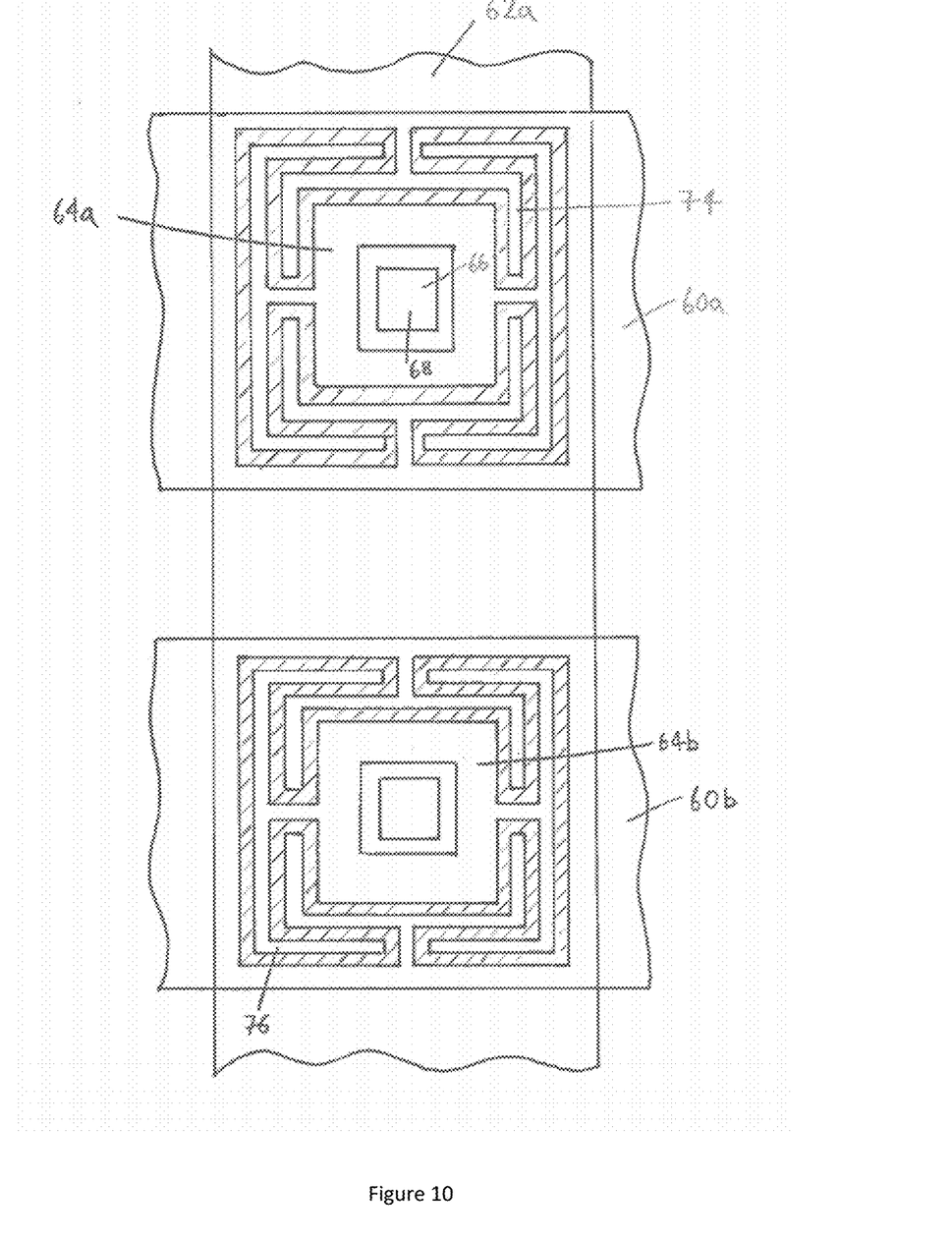

The arrangements schematically illustrated in FIGS. 9 and 10 are similar to those illustrated in FIGS. 5 to 8, expect that an increase in the W:L ratio is achieved by patterning the island drain conductor and the source conductors such that both conductors define interdigitated fingers 74, 76 that mainly extend around the centre of the island drain conductor.

In each of the arrangements illustrated in FIGS. 5 to 10, each drain conductor is connected to a respective pixel conductor via the interlayer interconnects 68; and in contrast to the arrangement shown in FIGS. 1 and 3, the pixel conductor associated with each TFT has at least a portion that lies directly above the gate line used to control the conductance of the semiconducting channel of that TFT (e.g. between on and off states). In order to substantially eliminate any capacitative coupling between the pixel conductor and the gate conductor for each TFT, a conductive, screening layer (not shown) is provided between the conductive layer defining the gate lines 60 and a top conductive layer defining the array of pixel conductors. The screening layer is a substantially continuous layer, except that it defines holes for the interlayer interconnects 68 between the drain conductors and the respective pixel conductors.

The semiconductor layer 36 may be a continuous, unpatterned layer that extends over the entire footprint of the transistor array, or the above-described techniques can be used in combination with some patterning of the semiconductor layer. For example, the semiconductor layer could be patterned by laser ablation using as a mask the conductor layer that defines the gate conductor lines and/or COM conductor lines. In any case, the above-described techniques make it possible to achieve at least the same level of isolation (reduction of parasitic leakage pathways) with less or no patterning of the semiconductor layer. When the patterning of the semiconductor layer would otherwise be carried out by e.g. laser ablation, the need for less or no patterning of the semiconductor layer 26 can have the advantages of producing less detrimental debris and less variation in the amount of isolation across the transistor array. Furthermore, in the case of a top-gate transistor array, the complete elimination of a semiconductor patterning step can have the advantage of reducing the wait time between deposition of the semiconductor and the deposition of the overlying gate dielectric. This reduction in wait time can lead to better performance by reducing the length of time for which the critical part of the semiconductor layer (i.e. the part that forms the critical interface with the gate dielectric layer) is potentially exposed to harmful debris, moisture or air.

Figure 11:
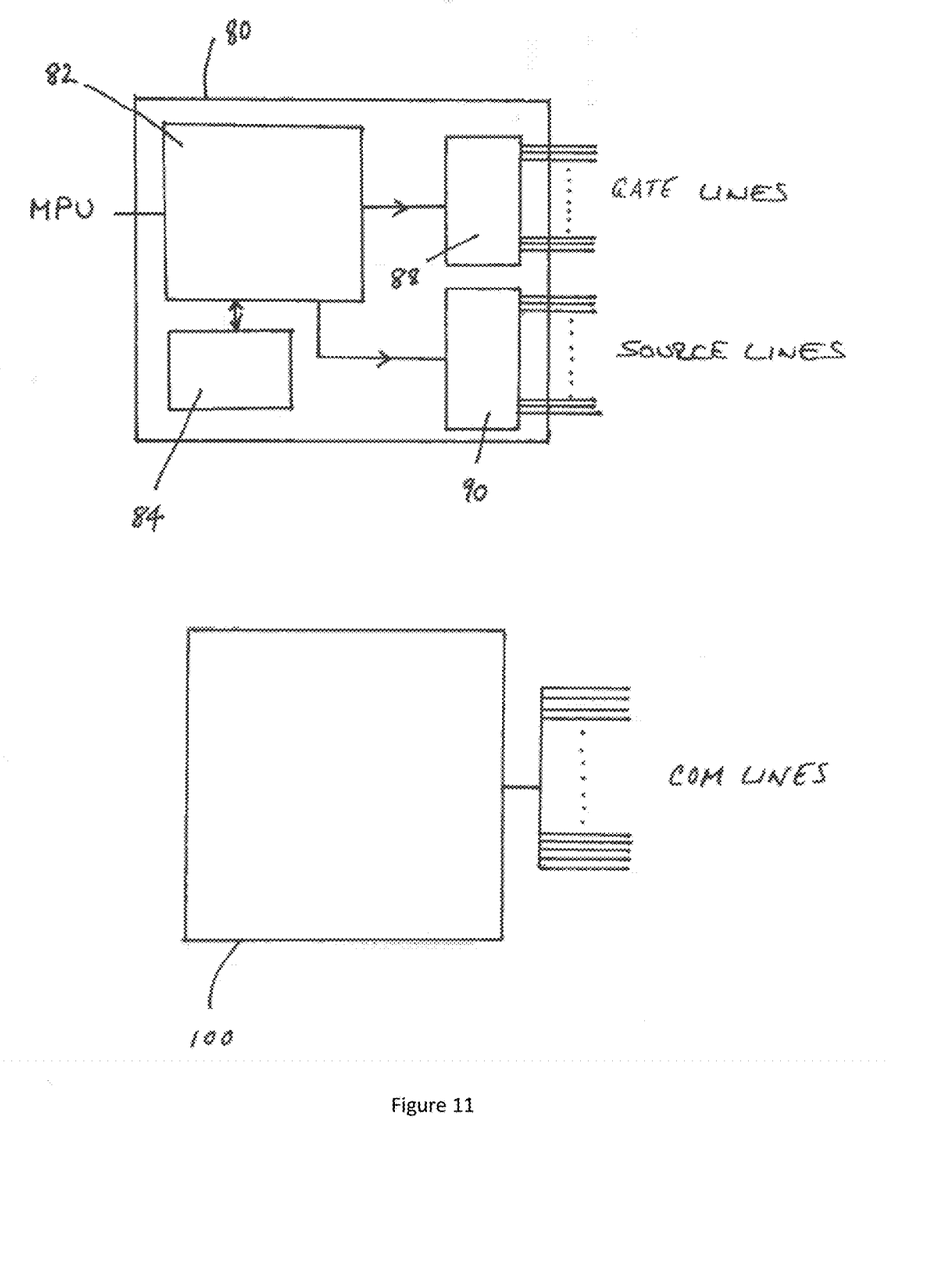
FIG. 11 schematically illustrates apparatus for controlling the voltages applied to the source and gate conductors in any of FIGS. 1 to 10, and apparatus for generating voltages applied to the common electrode lines in FIGS. 1 and 2.

FIG. 11 illustrates one example of apparatus for controlling the voltages applied to the source conductors and gate conductors. The apparatus includes a driver integrated circuit (IC) 80. The single chip driver IC 80 comprises a gate driver block 86, a source driver block 88, a logic block 82 and a memory block 84. The functions of the logic block 82 include: interfacing between the driver IC 80 and a main processing unit (MPU); transferring data to and from the memory 84; co-ordinating the signals applied by the gate and source driver blocks to the gate and source conductors;

and controlling the transfer of output data to the source driver. The driver IC 80 may include other blocks. FIG. 11 also schematically illustrates a high voltage generator 100 for generating a common "off" voltage for applying simultaneously to all COM lines 18 in the devices of FIGS. 1 and 2. In this example, the COM lines 18 are driven directly from the high voltage power generator.

In addition to the modifications explicitly mentioned above, it will be evident to a person skilled in the art that various other modifications of the described embodiment may be made within the scope of the invention.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features.

The invention claimed is:

1. A method of operating a device comprising an array of transistors, wherein the device comprises: a first conductor layer defining a plurality of source conductors, each source conductor associated with a respective group of transistors, and a plurality of drain conductors each associated with a respective transistor, each drain conductor comprising a drain electrode, and a pad conductor connected to the drain electrode a semiconductor layer defining semiconductor channels between said source and drain conductors for said array of transistors; a second conductor layer defining a plurality of gate conductors each associated with a respective set of transistors, and one or more storage capacitor conductors overlapping with a whole area of the drain pads for a respective set of transistors; wherein the method comprises:
   using the gate conductors to switch the transistors between on and off states; and
   using the storage capacitor conductors to reduce the conductivity of one or more portions of the semiconductor layer connecting the drain conductor of each transistor in the on state to source and/or drain conductors other than those associated with that transistor.

2. The method according to claim 1, wherein each drain conductor comprises a line conductor connecting the pad conductor to the drain electrode, and wherein said one or more storage capacitor conductors are configured to overlap with the whole of a perimeter portion of the semiconductor layer at the perimeter of each pad conductor.

3. A device comprising an array of transistors, wherein the device comprises a first conductor layer defining a plurality of source conductors each associated with a respective group of transistors, and a plurality of drain conductors each associated with a respective transistor; and a semiconductor layer providing the semiconductor channels for said array of transistors; wherein each source conductor is configured to lie between all conducting paths between the group of drain conductors associated with that source conductor and all other source conductors via the semiconductor layer.

4. The device according to claim 3, wherein the group of drain conductors associated with a source conductor extend in a first direction, and each source conductor comprises two line conductors extending in said first direction on opposite sides of said group of drain conductors associated with the source conductor.

5. The device according to claim 4, wherein each source conductor comprises further conductors connecting said two line conductors in regions between drain conductors associated with the source conductor.

6. The device according to claim 4, wherein the device further comprises a plurality of gate conductors, each gate conductor is capacitatively coupled to the semiconducting channels for a respective set of transistors, and is also capacitatively coupled to a portion of the drain conductors for another set of transistors whose semiconducting channels are capacitatively coupled to an adjacent gate conductor; and wherein each source conductor comprises one or more portions extending between the drain conductors of adjacent transistors in the same group of transistors associated with the same source conductor.

7. The device according to claim 3, wherein each source conductor wholly encompasses the drain conductors associated with the source conductor.

8. An apparatus for operating a device comprising an array of transistors, wherein the device comprises:
   a first conductor layer defining a plurality of source conductors, each source conductor associated with a respective group of transistors, and a plurality of drain conductors each associated with a respective transistor, each drain conductor comprising a drain electrode, and a pad conductor connected to the drain electrode;
   a semiconductor layer defining semiconductor channels between said source and drain conductors for said array of transistors;
   a second conductor layer defining a plurality of gate conductors each associated with a respective set of transistors, and one or more storage capacitor conductors overlapping with a whole area of the drain pads for a respective set of transistors;
   wherein the apparatus is configured to apply different voltages to the gate conductors to switch the transistors between on and off states; and
   is further configured to apply a voltage to the storage capacitor conductors that reduces the conductivity of one or more portions of the semiconductor layer connecting the drain conductor of each transistor in the on state to source and/or drain conductors other than those associated with that transistor.

9. The apparatus according to claim 8, wherein each drain conductor comprises a pad conductor connected by a line conductor to a drain electrode, and wherein said one or more storage capacitor conductors are configured to overlap with the whole of a perimeter portion of the semiconductor layer at the perimeter of each pad conductor.

10. A method according to claim 1, wherein the source conductor associated with a transistor wholly encompasses the drain conductor for the transistor, including the drain pad that overlaps with one of said storage capacitor conductor, and the drain electrode that overlaps with one of the gate conductor.

11. The method according to claim 1, wherein said semiconductor layer is unpatterned and continuous over the entire array of transistors.

12. The device according to claim 7, wherein part of the drain conductor encompassed by the source conductor overlaps with a storage capacitor conductor, and part of the drain conductor encompassed by the source conductor overlaps with a gate conductor.

13. The device according to claim 3, wherein the source conductor for a transistor wholly encompasses the drain conductor for the transistor, and the drain conductor includes outwardly radially extending projections that extend into regions between inwardly radially projections of the source conductor.

14. The device according to claim 3, wherein the source conductor for a transistor wholly encompasses the drain conductor for the transistor, and the source and drain conductors define interdigitated fingers that extend around the centre of the drain conductor.

15. The device according to claim 3, wherein said semiconductor layer is unpatterned and continuous over the entire array of transistors.

16. The apparatus according to claim 8, wherein the source conductor associated with a transistor wholly encompasses the drain conductor for the transistor, including the drain pad that overlaps with one of the storage capacitor conductors, and the drain electrode that overlaps with one of the gate conductors.

17. The apparatus according to claim 8, wherein said semiconductor layer is unpatterned and continuous over the entire array of transistors.

* * * * *